(12) United States Patent
Boone, Jr. et al.

(10) Patent No.: US 8,035,927 B2
(45) Date of Patent: Oct. 11, 2011

(54) EMR MAGNETIC SENSOR HAVING ITS ACTIVE QUANTUM WELL LAYER EXTENDING BEYOND AN OVER-LYING SEMICONDUCTOR LAYER END WITH TAB AND LEAD STRUCTURE FOR IMPROVED ELECTRICAL CONTACT

(75) Inventors: Thomas Dudley Boone, Jr., San Jose, CA (US); Liesl Folks, Campbell, CA (US); Robert E. Fontana, Jr., San Jose, CA (US); Bruce Alvin Gurney, San Jose, CA (US); Jordan Asher Katine, Mountain View, CA (US); Sergio Nicoletti, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 890 days.

(21) Appl. No.: 12/021,085

(22) Filed: Jan. 28, 2008

(65) Prior Publication Data
US 2009/0190269 A1 Jul. 30, 2009

(51) Int. Cl.
*G11B 5/39* (2006.01)
(52) U.S. Cl. .............. 360/313; 360/322; 360/324
(58) Field of Classification Search ....... 360/313–324.2; 257/421–427; 324/244–263; 365/145, 158, 365/171–173; 428/810–816
See application file for complete search history.

(56) References Cited

U.S. PATENT DOCUMENTS

| | | | |
|---|---|---|---|
| 4,482,907 A | 11/1984 | Jay | 357/22 |
| 4,853,341 A | 8/1989 | Nishioka et al. | 437/24 |
| 4,912,451 A | 3/1990 | Sugiyama et al. | 338/32 |
| 5,338,692 A | 8/1994 | Wieck et al. | 437/24 |
| 5,430,592 A | 7/1995 | Yoda | 360/113 |
| 6,117,690 A | 9/2000 | Bennett et al. | 438/3 |
| 6,281,025 B1 | 8/2001 | Ring et al. | 438/10 |
| 6,707,122 B1 | 3/2004 | Hines et al. | 257/421 |
| 6,714,374 B1 | 3/2004 | Hayashi et al. | 360/66 |

(Continued)

FOREIGN PATENT DOCUMENTS

GB 2279806 1/1995

(Continued)

OTHER PUBLICATIONS

Solin et al., "Room Temperature Extraordinary Magnetoresistance of Nonmagnetic Narrow-Gap Semiconductor/Metal Composites: Application to Read-Head Sensors for Ultrahigh-Density Magnetic Recording" IEEE Transactions on Magnetics, vol. 38, No. 1, Jan. 2002.

(Continued)

*Primary Examiner* — A. J. Heinz
(74) *Attorney, Agent, or Firm* — Zilka-Kotab, PC

(57) ABSTRACT

An extraordinary magnetoresistive sensor (EMR sensor) having a lead structure that is self aligned with a magnetic shunt structure. To form an EMR sensor according to an embodiment of the invention, a plurality of layers are deposited to form quantum well structure such as a two dimensional electron gas structure (2DEG). A first mask structure is deposited having two openings, and a material removal process is performed to remove portions of the sensor material from areas exposed by the openings. The distance between the two openings in the first mask defines a distance between a set of leads and the shunt structure. A non-magnetic metal is then deposited. A second mask structure is then formed to define shape of the leads.

14 Claims, 15 Drawing Sheets

U.S. PATENT DOCUMENTS

| | | | |
|---|---|---|---|
| 6,729,014 B2 | 5/2004 | Lin et al. | 29/603.14 |
| 6,822,837 B2 | 11/2004 | Kasahara et al. | 360/324.2 |
| 6,930,862 B2 | 8/2005 | Gill et al. | 360/313 |
| 7,633,718 B2 * | 12/2009 | Fontana et al. | 360/245.8 |
| 2004/0218309 A1 | 11/2004 | Seigler | 360/313 |
| 2006/0018054 A1 | 1/2006 | Chattapadhyay et al. | 360/313 |
| 2006/0022672 A1 | 2/2006 | Chattapadhyay et al. | 324/252 |
| 2007/0285848 A1 * | 12/2007 | Williams et al. | 360/324.1 |

FOREIGN PATENT DOCUMENTS

| | | |
|---|---|---|
| JP | 59130425 | 7/1984 |
| JP | 61071628 | 4/1986 |
| JP | 61170073 | 7/1986 |
| JP | 63054785 | 3/1988 |
| JP | 63131523 | 6/1988 |
| JP | 03049241 | 3/1991 |
| JP | 03165576 | 7/1991 |
| JP | 2000285418 | 10/2000 |

OTHER PUBLICATIONS

Hu et al., "Spin-polarized transport in a two-dimensional electron gas with interdigital-ferromagnetic contacts" Physical Review B, vol. 63, 125333; Mar. 2001.

Heiblum et al., "Simplified Method for Forming Narrow Gates Across Conduction Channels in Two-Dimensional Electron-Gas Heterostructure Devices" IBM Technical Disclosure Bulletin, Aug. 1991.

Patel et al., "Independent, contacting to electron layers in a double quantum well system using Pd-Ge shallow ohmic contacts" American Institute of Physics. Aug, 15, 1994, pp. 851-853.

Vijendran et al., "Focused ion beam patterned Hall bars and Ohmic columns embedded in molecular-beam-epitaxial-grown GaAs/AlGaAS" American Vacuum Society, Nov./Dec. 2001, pp. 2761-2765.

* cited by examiner

EMR MAGNETIC SENSOR HAVING ITS ACTIVE QUANTUM WELL LAYER EXTENDING BEYOND AN OVER-LYING SEMICONDUCTOR LAYER END WITH TAB AND LEAD STRUCTURE FOR IMPROVED ELECTRICAL CONTACT

FIELD OF THE INVENTION

The present invention relates generally to extraordinary magnetoresistive (EMR) sensors and more particularly to an EMR sensor having a very narrow lead spacing, manufactured by a method that overcomes lithographic alignment limitations.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk, lifting the head. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a tree layer. First and second leads are connected to the spin valve sensor for conducting a sense current therethrough. The magnetization of the pinned layer is oriented generally perpendicular to the air bearing surface (ABS) and the magnetic moment of the free layer is oriented generally parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons are scattered by the interfaces of the spacer layer with each of the pinned and free layers and within the ferromagnetic layers. When the magnetizations of the pinned and tree layers are parallel with respect to one another, scattering is minimal and when the magnetizations of the pinned and free layer are antiparallel, scattering is maximized. Changes in scattering alter the resistance of the spin valve sensor in proportion to $\cos\theta$, where $\theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals. Even more recent read head sensor designs use magnetic tunnel junctions (or tunnel magnetoresistance) where the metallic spacer of the GMR structure is replaced with a tunneling barrier.

The drive for ever increased data rate and data capacity has, however, lead researchers to search for new types of magnetoresistive sensors, capable of increased sensitivity and high signal to noise ratio at decreased track widths. One type of magnetoresistive sensor that has been proposed is what has been called an Extraordinary Magnetoresistive Sensor (EMR). An advantage of EMR sensors is that the active region of the EMR sensor is constructed of non-magnetic semiconductor materials, and does not suffer from the problem of magnetic noise that exists in giant magnetoresistive (GMR) and tunnel magnetoresistance (TMR) sensors, both of which use magnetic films in their active regions.

The EMR sensor includes a pair of voltage leads and a pair of current leads in contact with one side of the active region and an electrically conductive shunt in contact with the other side of the active region. In the absence of an applied magnetic field, sense current conducted through the current leads passes into the semiconductor active region and is shunted through the shunt. When an applied magnetic field is present, current is deflected from the shunt and passes primarily through the semiconductor active region. The change in electrical resistance due to the applied magnetic field is detected across the voltage leads. An EMR sensor is described by T. Zhou et al., "Extraordinary magnetoresistance in externally shunted van der Pauw plates", Appl. Phys. Lett., Vol. 78, No. 5, 29 Jan. 2001, pp. 667-669.

However, even with the advantages of such EMR devices, there is an ever pressing need for increasing the data rate and data density of data that can be read from a device. As these EMR devices become ever smaller, the ability to create the necessary extremely small leads and extremely small lead spacing is limited by the resolution limits of current photolithographic techniques and by the need to align multiple photolithographic patterning steps.

Therefore, there is a strong felt need for an EMR sensor design and method of manufacture that can allow such a sensor to be constructed at very small sizes in a planar structure with self aligned contacts. Such a structure and/or method would preferably allow the leads of such devices to be constructed with extremely small lead spacing so as to allow very short magnetic bits to be read.

SUMMARY OF THE INVENTION

The present invention an Extraordinary Magnetoresistive (EMR) sensor having first second and third semiconductor layers, the second layer being sandwiched between the first and third layers and forming a 2 dimensional electron gas (2DEG) therebetween. The third semiconductor layer has first and second sides, and the second semiconductor layer extends beyond the first side and has a plurality of tab structures that extend beyond the second side. The sensor also includes an electrically conductive shunt structure formed adjacent to the first side of the third semiconductor layer and contacting a surface of the second semiconductor layer where the second semiconductor layer extends beyond the first side, and includes a plurality of electrically conductive leads each one of the plurality of electrically conductive leads contacting one of the tab structures of the second semiconductor layers.

The invention advantageously provides an extraordinary magnetoresistive sensor (EMR sensor) having a lead structure that is self aligned with a magnetic shunt structure. To form an EMR sensor according to an embodiment of the invention, a plurality of layers are deposited to form quantum well structure such as a two dimensional electron gas structure (2DEG). A first mask structure is deposited having two openings, and a material removal process is performed to remove portions of the sensor material from areas exposed by the openings. The distance between the two openings in the first mask defines a distance between a set of leads and the shunt structure. A non-magnetic metal is then deposited. A second mask structure is then formed to define shape of the leads.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
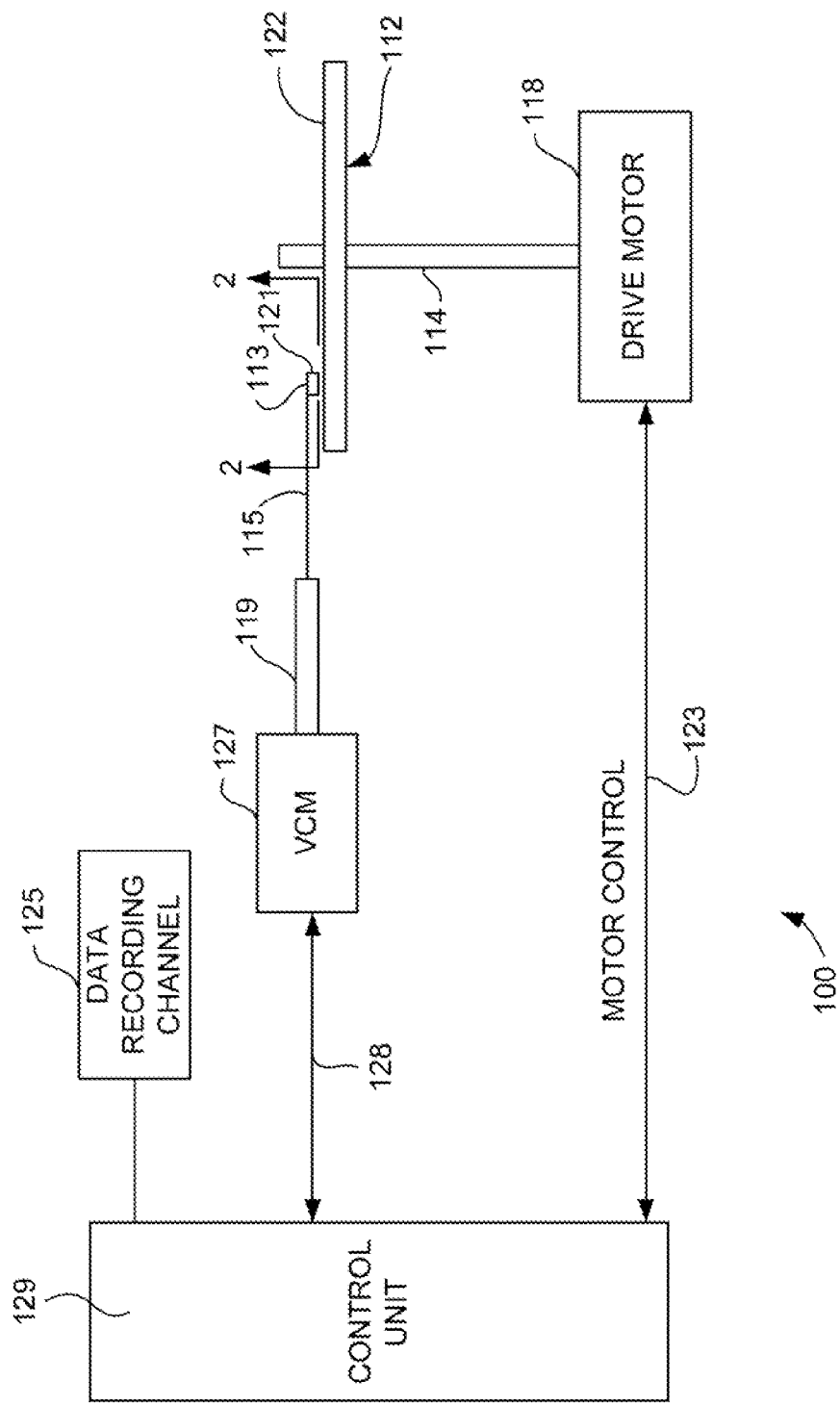
FIG. 1 is a schematic illustration of a disk drive system in which the invention might be embodied.

Referring now to FIG. 1, there is shown a disk drive 100 which could embody this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider 113. The air bearing thus counterbalances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control Signals on line 128. The control signals on line 128 provide the desired current profiles to optimally move and position slider 113 to the desired data track on disk 112. Write and read signals are communicated to and from write and read heads 121 by way of recording channel 125. The read portion of the head 121 can be an Extraordinary Magnetoresistive (EMR) sensor such as will be described below.

Figure 2:
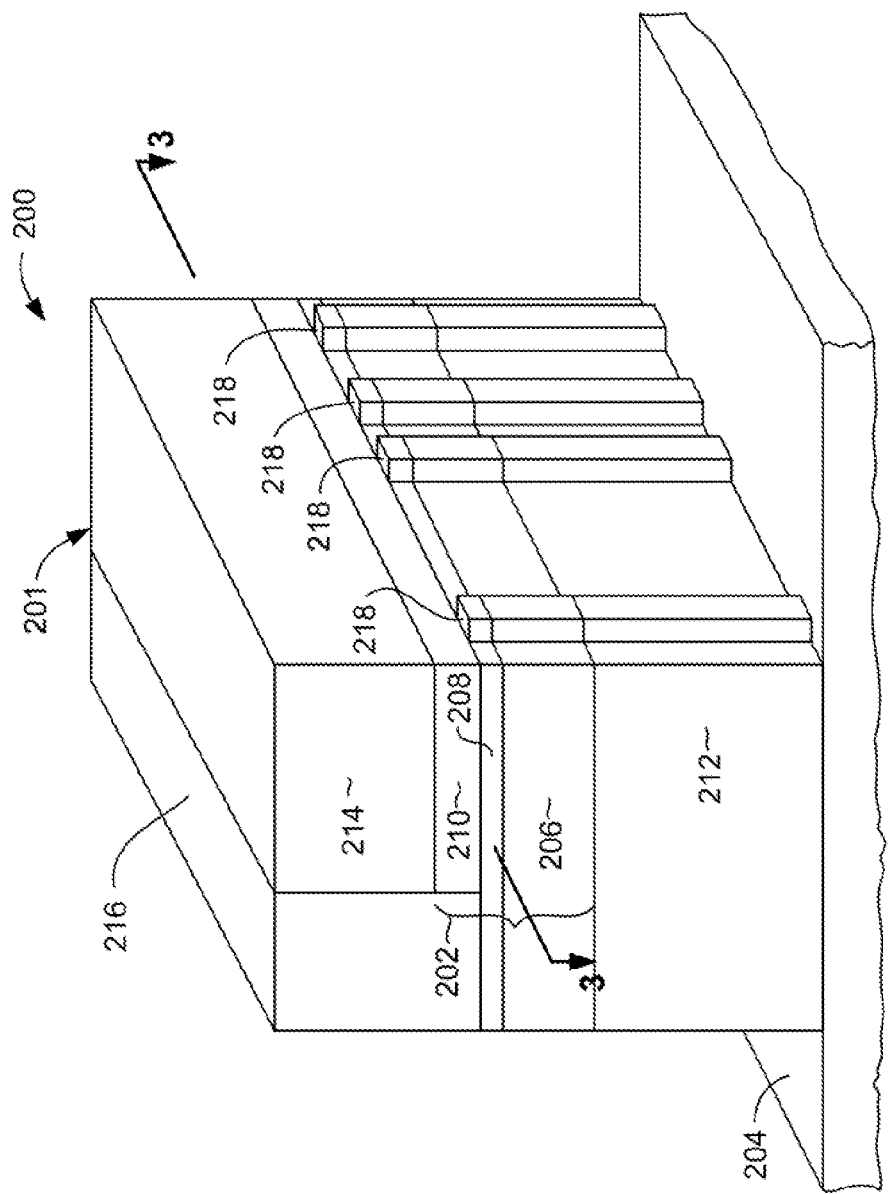
FIG. 2 is a perspective view of an EMR sensor according to an embodiment of the invention, shown with leads removed.

With reference now to FIG. 2, an Extraordinary MagnetoResistive sensor (EMR) sensor 200 is shown according to a possible embodiment of the invention. In FIG. 2 the electrical leads are not shown for clarity. The EMR sensor 200 includes a mesa structure 201 formed on a substrate 204 such as a wafer. The mesa structure 201 includes a heterostructure 202 that includes a 2 Dimensional Electron Gas (2-DEG) 208 sandwiched between first and second layers of higher resistance semiconductor layers 206, 210. The mesa structure 201 can also include a buffer layer 212 underlying the structure 202. A capping layer 214 may also be provided at the top of the mesa structure to protect the underlying layers 206-210 of the mesa structure 201. The EMR sensor 201 also includes an electrically conductive shunt structure 216, and as can be seen in FIG. 2, the shunt structure 216 only extends to the level of the 2DEG layer 208, the shunt structure 216 making electrical contact with the 2DEG layer 208.

The EMR sensor 200 may include a structure 202 that is a III-V heterostructure formed on a semiconductor substrate 204 such as GaAs. However, the EMR sensor described in this invention is not restricted to III-V semiconductor materials. For example, it may also be formed on the basis of silicon or germanium. The heterostructure 202 can include a first layer 206 of semi-conducting material having a first band-gap, a second layer 208 of semi-conducting material formed on the first layer 206 and having a second bandgap that is smaller than that of the first layer 206, and a third semi-conducting layer 210 of semi-conducting material formed on top of the second layer 208 and having a third band gap that is greater than the second band gap. The materials in the first and third layers 206, 210 may be similar or identical. An energetic potential well (quantum well) is created by the first, second and third semi-conducting material layers 206, 208, 210 due to the different band-gaps of the different materials. Thus, carriers can be confined inside layer 208, which is considered the EMR active film in the sensor 200. Because the layer 208 is extremely thin, and because electrons travel very fast and at very long distances without scattering, this layer 208, forms what has been referred to as a 2 Dimensional Electron Gas (2DEG).

The first layer 206 is typically formed on top of a buffer layer 212 that may be one or more layers. The buffer layer 212 comprises several periods of a super-lattice structure that functions to prevent impurities present in the substrate from migrating into the functional layers 206, 208, 210. In addition, the buffer layer 212 is chosen to accommodate the typically different lattice constants of the substrate 204 and the functional layers of the heterostructure 202 to thus act as a strain relief layer between the substrate and the functional layers.

One or more doped layers can be incorporated into the semiconducting material in the first layer 206, the third layer 210, or both layers 206 and 210, and spaced apart from the boundary of the second and third semiconducting materials. Dopants are also sometimes incorporated in layer 212 or 214 at locations near layers 206 or 210. The doped layers provide electrons (if n-doped) or holes (if p doped) to the quantum well. The electrons or holes are concentrated in the quantum well in the form of a two dimensional electron-gas or hole-gas, respectively.

The layers 206, 208, 210 may be a $Al_{0.09}In_{0.91}Sb/InSb/Al_{0.09}In_{0.91}Sb$ or AlSb/InAs/AlSb heterostructure grown onto a semi-insulating GaAs substrate 204 with a buffer layer 212 in between. InSb and InAs are narrow band-gap semiconductors. Narrow band-gap semiconductors typically have a high electron mobility, since the effective electron mass is greatly reduced. Typical narrow band-gap materials are InSb and InAs. For example, the room temperature electron mobility of InSb and InAs are 70,000 $cm^2$/Vs and 35,000 $cm^2$/Vs, respectively.

The bottom $Al_{0.09}In_{0.91}Sb$ or GaAlSb layer 206 formed on the buffer layer 212 has a thickness in the range of approximately 1-3 microns and the top $Al_{0.09}In_{0.91}Sb$ or AlSb layer 210 has a thickness in the range of approximately 1 to 20 nm. The doping layers incorporated into layers 206, 210 have a thickness from less than one monolayer (delta-doped layer) up to 10 nm. The doping layer is spaced from the InSb/$Al_{0.09}In_{0.91}Sb$ boundaries of first and second or second and third semi-conducting materials by a distance of 10-300 Angstrom. N-doping is preferred, since electrons typically have higher mobility than holes. The typical n-dopant is silicon with a concentration of about $1\times10^{19}/cm^3$. The deposition process for the heterostructure 202 is preferably molecular-beam-epitaxy, but other growth methods can be used.

A capping layer 214 is formed over the heterostructure 202 to protect the device from corrosion. The capping layer 214 is formed of an insulating material such as oxides or nitrides of aluminum or silicon (e.g., $Si_3N_4$, $Al_2O_3$), phases of carbon (such as diamond like carbon) or a non-corrosive semi-insulating semiconductor.

The layers 212, 206, 208, 210, 214 together form a structure that can be referred to as a mesa structure 201. FIG. 2 is a view of an EMR sensor 200, shown with the leads removed for clarity. The mesa structure 201 has notches 218 that extend from a side of the mesa structure 201 opposite the shunt structure 216. It can be seen that the notches 218 start at the level of the 2DEG material layer 208, and extend downward therefrom. Although the electrically conductive voltage and current leads are not shown in FIG. 2, they would be formed over the top of the notches, extending outward, and would be advantageously self aligned with the notches, as will be better understood below.

Figure 3:
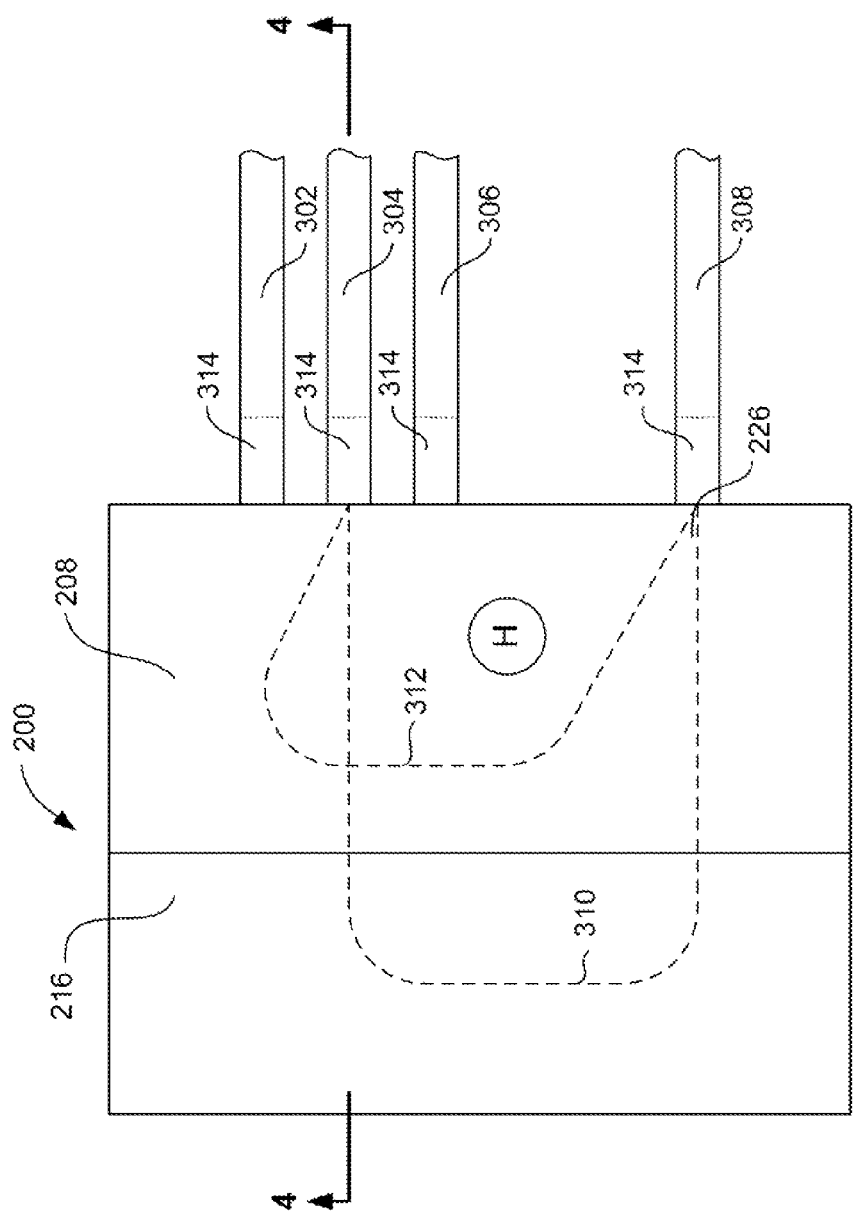
FIG. 3 is a top down sectional view taken from line 3-3 of FIG. 2.
Figure 4:
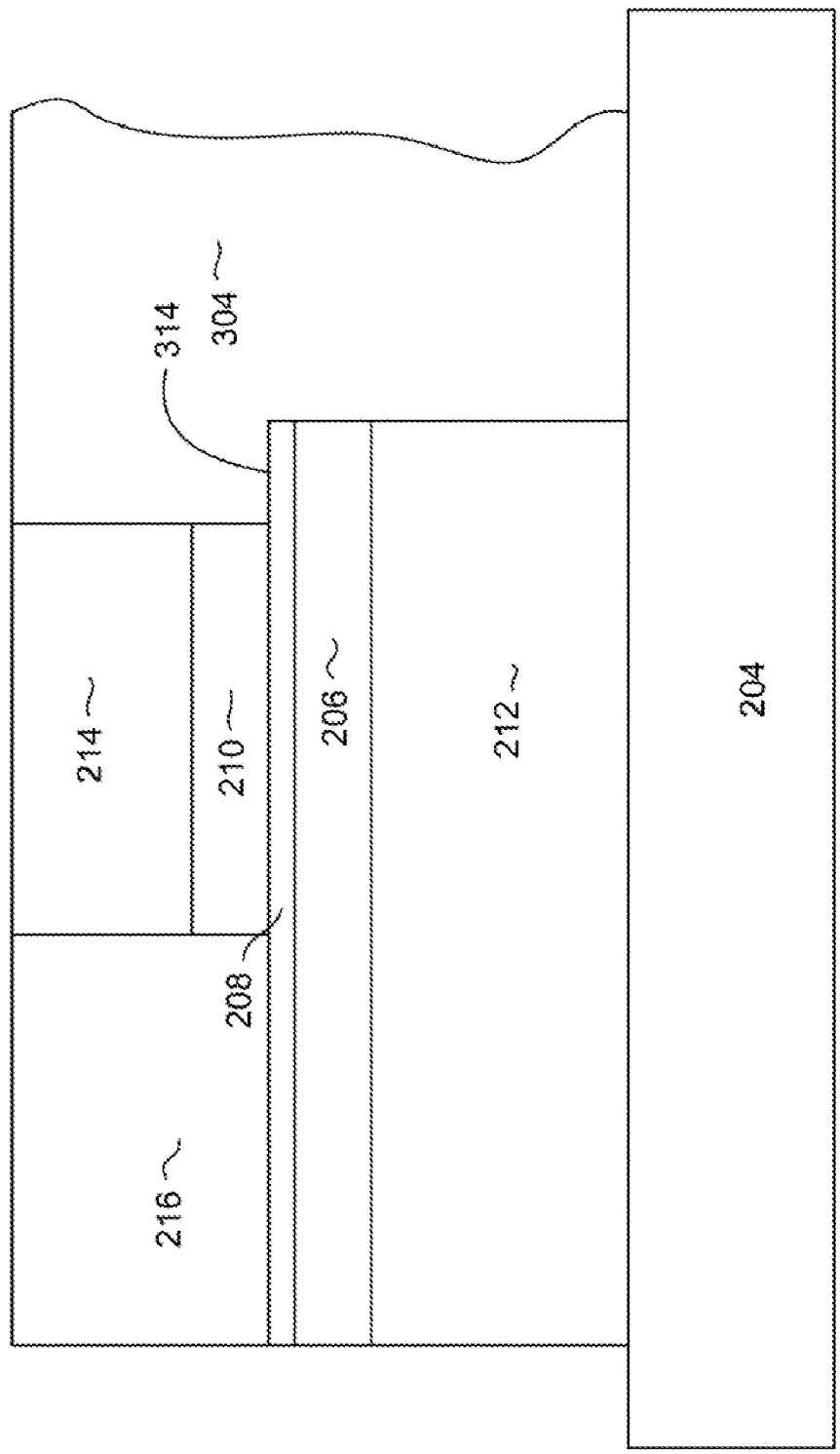
FIG. 4 is a cross sectional view taken from line 4-4 of FIG. 3.

With reference now to FIG. 3, a top down view of the sensor 200 taken from line 2-2 of FIG. 2. The view in FIG. 3 shows a top down, view of the 2DEG portion 208 of the sensor 200, During operation, a sense current is supplied through current leads 308, 304. In the absence of a magnetic field, this sense current 310 flows through to the electrically conductive shunt structure 216, where it passes with relatively little electrical resistance. However, in the presence of a magnetic field (such as from a magnetic medium) the sense current is deflected away from the shunt 216 so that more of it flows through the 2DEG 208 as indicated by dashed line 312. This increases the electrical resistance, which is detected by voltage leads 302, 306, thereby allowing the magnetic field to be detected as an electrical signal.

in FIG. 3, it can be seen that, the leads 302, 204, 306, 308 overlay tabbed portions 314, of the 2DEG and extend outward. Because the tabs 314 are hidden beneath the leads 302, 304, 306, 308 as viewed in FIG. 3, they are indicated with dashed lines. The leads 302, 304, 308 are advantageously self aligned with the tabs 314, by a method that will be described below. The orientation of the leads 302, 304, 306, 308 can be better understood with reference to FIG. 4, which shows a cross sectional view taken from line 4-4 of FIG. 3. FIG. 4 shows a cross section of the current lead 304 formed over and extending from the tabbed portion 314. It should be pointed out that, while FIG. 4 shows the current lead 304, a similar arrangement would apply for leads 302, 306, and 308. As can be seen, then, the lead extends over the 2DEG 208 where the 2DEG 208 extends outward at the tabbed portion 314. This advantageously increases the electrical contact between the lead 304 and the 2DEG, thereby reducing the parasitic resistance and improving sensor performance.

Figure 5:
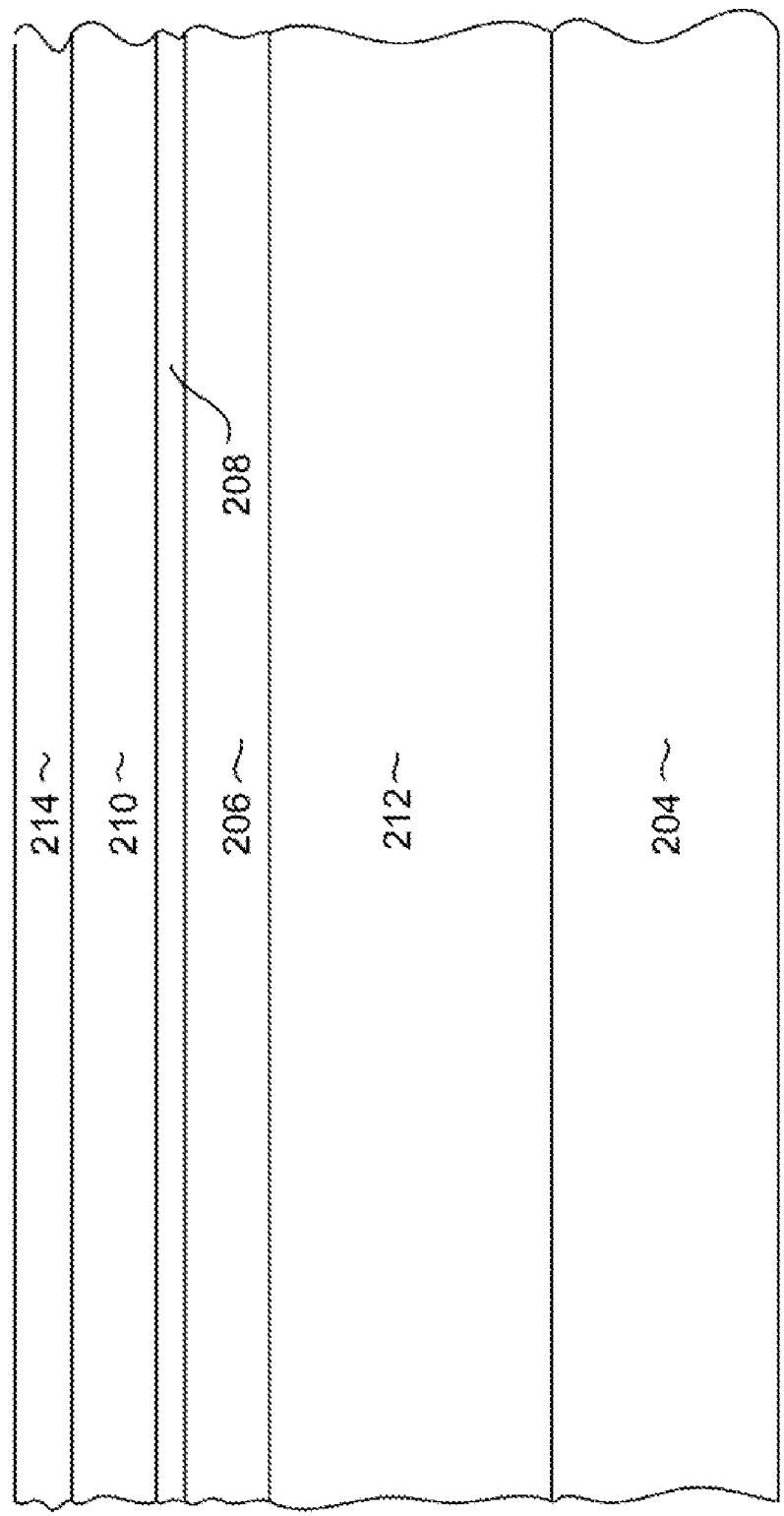
FIGS. 5-15 are views of an EMR device in various intermediate stages of manufacture, illustrating a method of manufacturing an EMR sensor according to an alternate embodiment of the invention.
Figure 6:
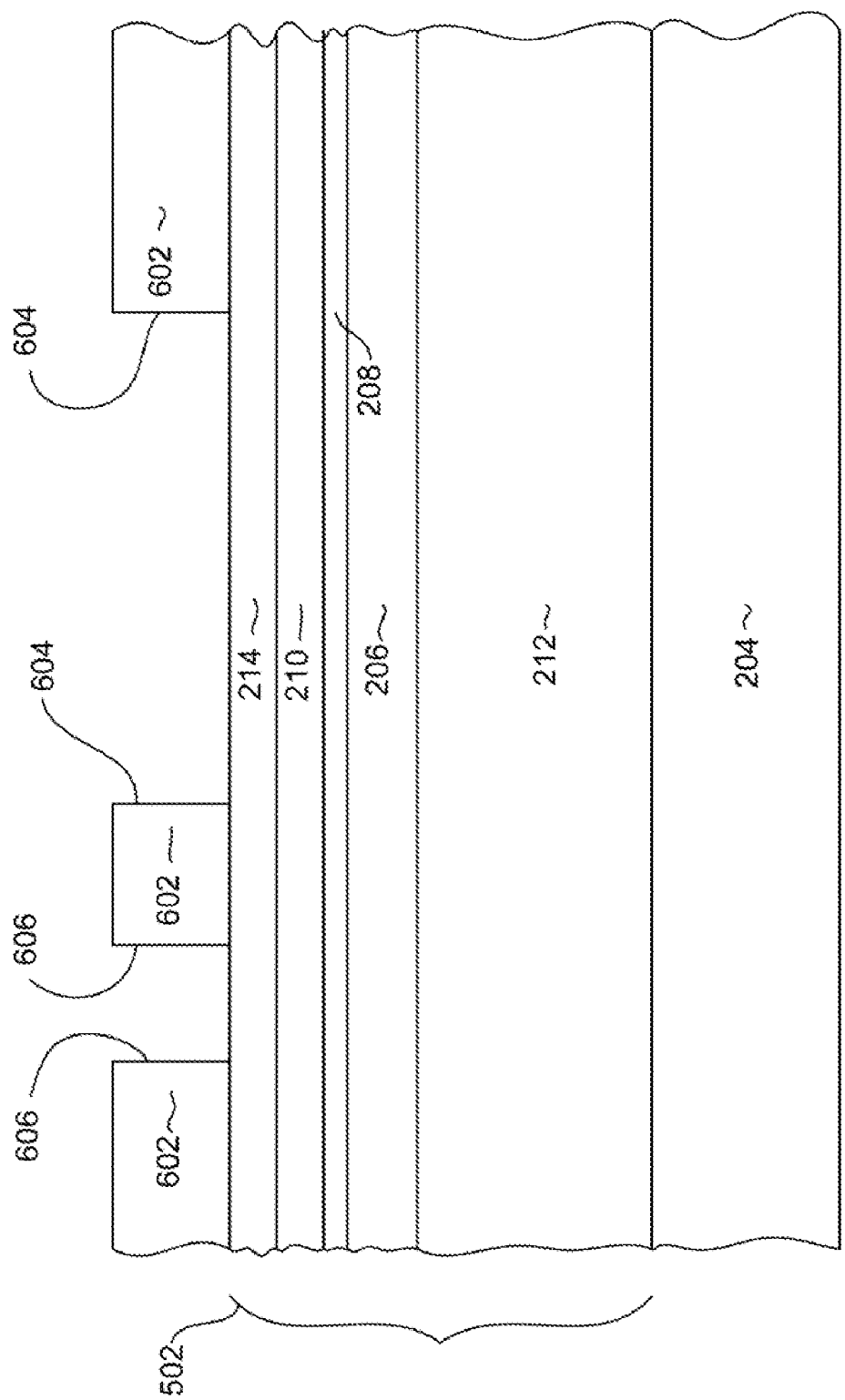
Figure 7:
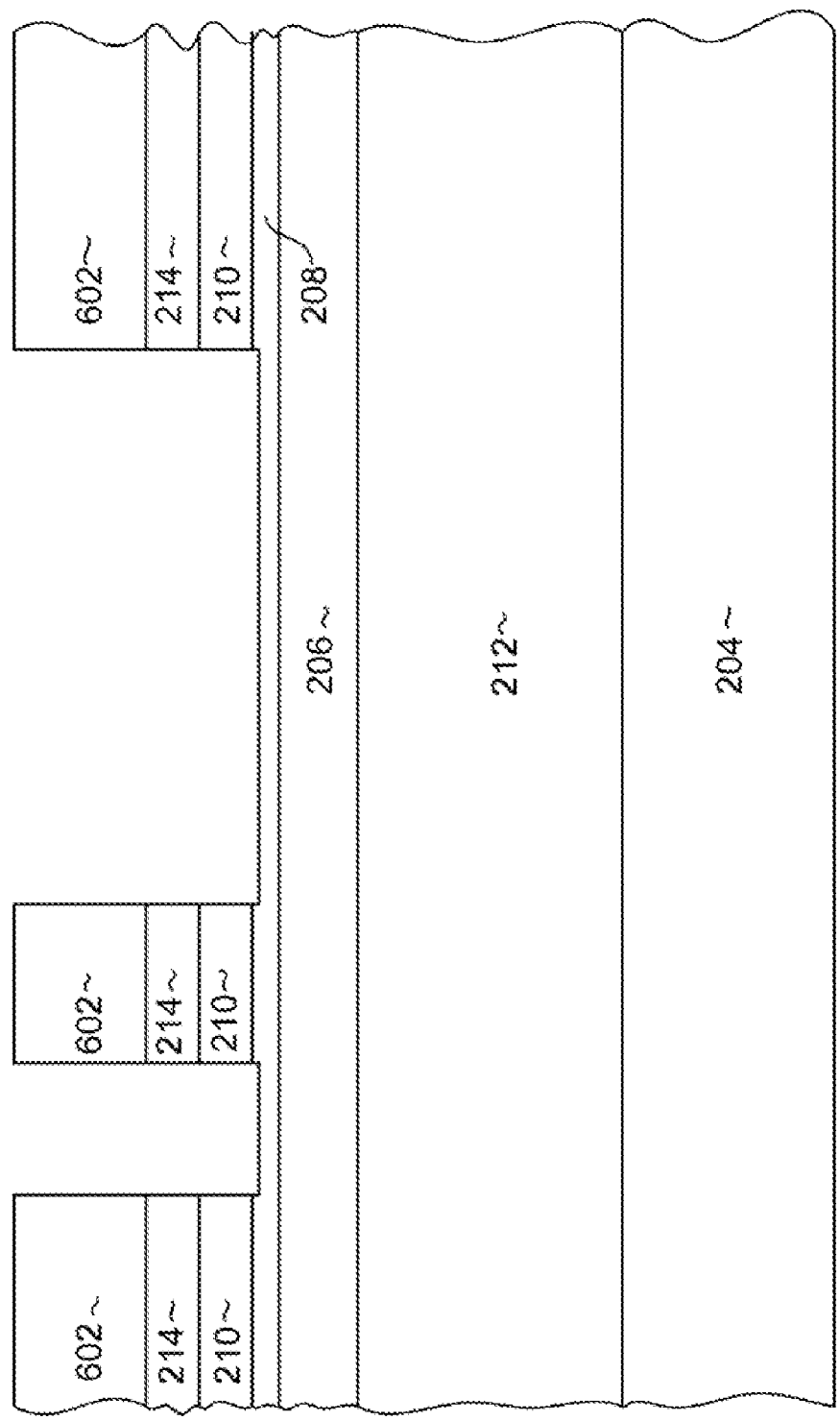

With reference now to FIGS. 5-15 a method for manufacturing a sensor according to an embodiment of the invention is described. With particular reference to FIG. 5, a plurality of EMR sensor layers 502 is grown on top of a substrate 200 such as a semiconductor wafer. As discussed above, the sensor layers 502 can include a buffer layer 212, a first semiconductor layer 206, a second semiconductor layer 208 (2DEG layer), a third semiconductor layer 210, and a capping layer 214. Then, with reference to FIG. 6 a mask structure such as a semiconductor mask 602 is formed over the sensor layers 502. The mask structure 602 can include a photolithographically patterned photoresist layer, and may include other layers such as a bottom antireflective coating layer, image transfer layer and one or more hard mask layers. The mask structure 602 is formed with two openings 604, 606. Then, an etching process is performed to remove portions of the buffer layer 214, and third semiconductor layer 210 that are not covered by the mask structure 602 (ie. portions that are exposed through the openings 604, 606. This etching is preferably Ion Beam Etching (IBE), performed by placing the wafer containing the substrate 204 and sensor layers 502 into an etching chamber of an Ion Beam Etching/Deposition tool.

An integrated Secondary Ion Mass Spectrometer (SIMS) is implemented to monitor the etching during the IBE process. Since the layers above the 2DEG layer 208 contain different elements than the 2DEG 208, measuring the real-time SIMS spectra allows for close monitoring of the depth of the etching and allows an accurate determination to be made of when the 2DEG 208 has been exposed. The sample could also be etched in a previous etching process using a monitor sample. In that case the etching process would be controlled by time, the termination point having been previously determined using the monitor sample.

Figure 8:
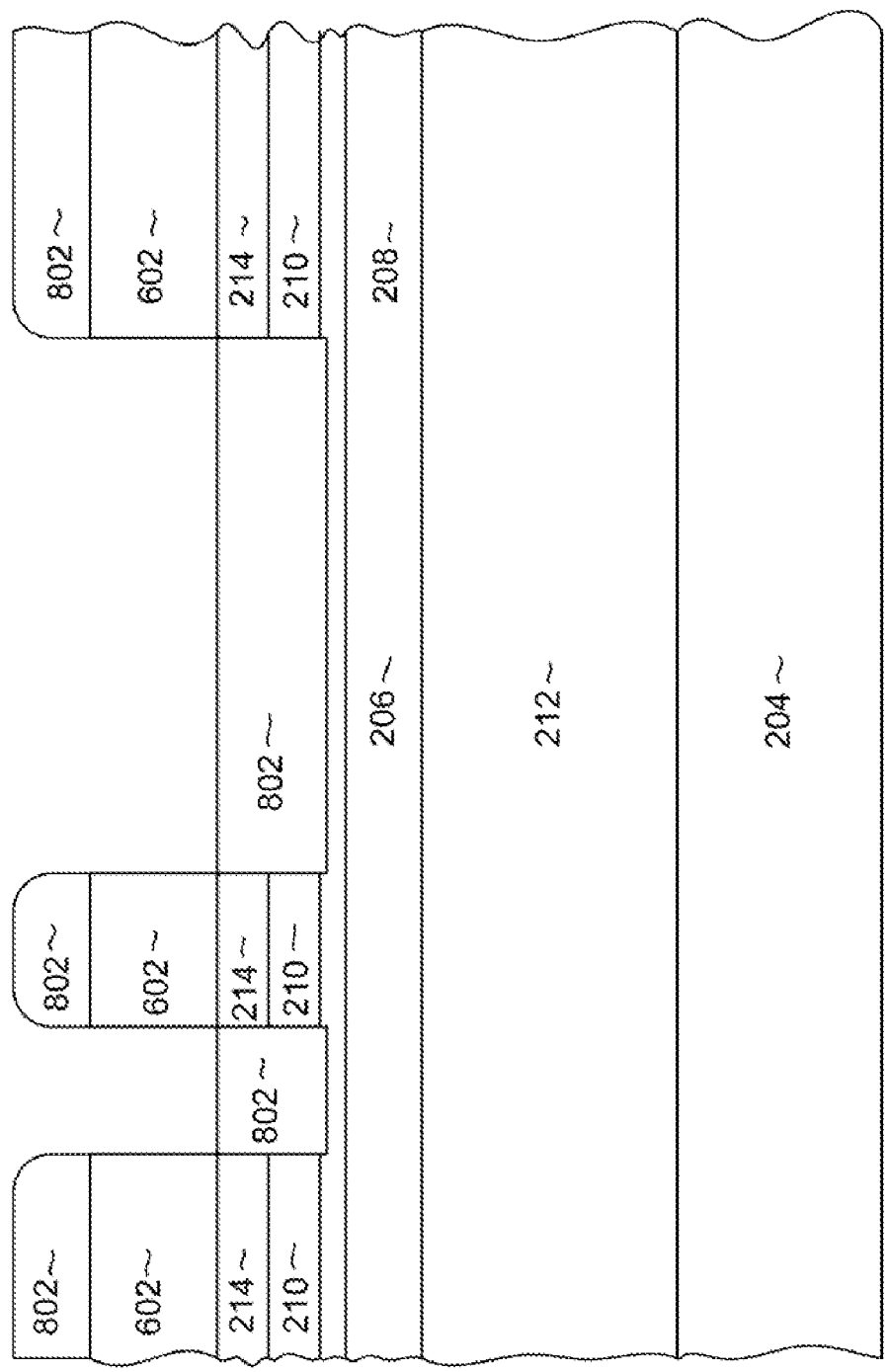

With reference now to FIG. 8, once the 2DEG layer 208 has been exposed, an electrically conductive, non-magnetic metal

802, such as Ta or Au, is deposited. The metal layer 802 can be a thin adhesion layer of Ta followed by a thicker layer of Au. The metal 802 is deposited in situ using Ion Beam Deposition (IBD) by moving the wafer from the etching chamber of the ion beam tool, to the ion beam deposition chamber of the ion beam tool. This deposition method (performed without breaking vacuum in the ion beam tool) prevents the formation of any oxide on the 2DEG layer 208, ensuring excellent, low resistance contact between the 2DEG 208 and the metal 802.

Figure 9:
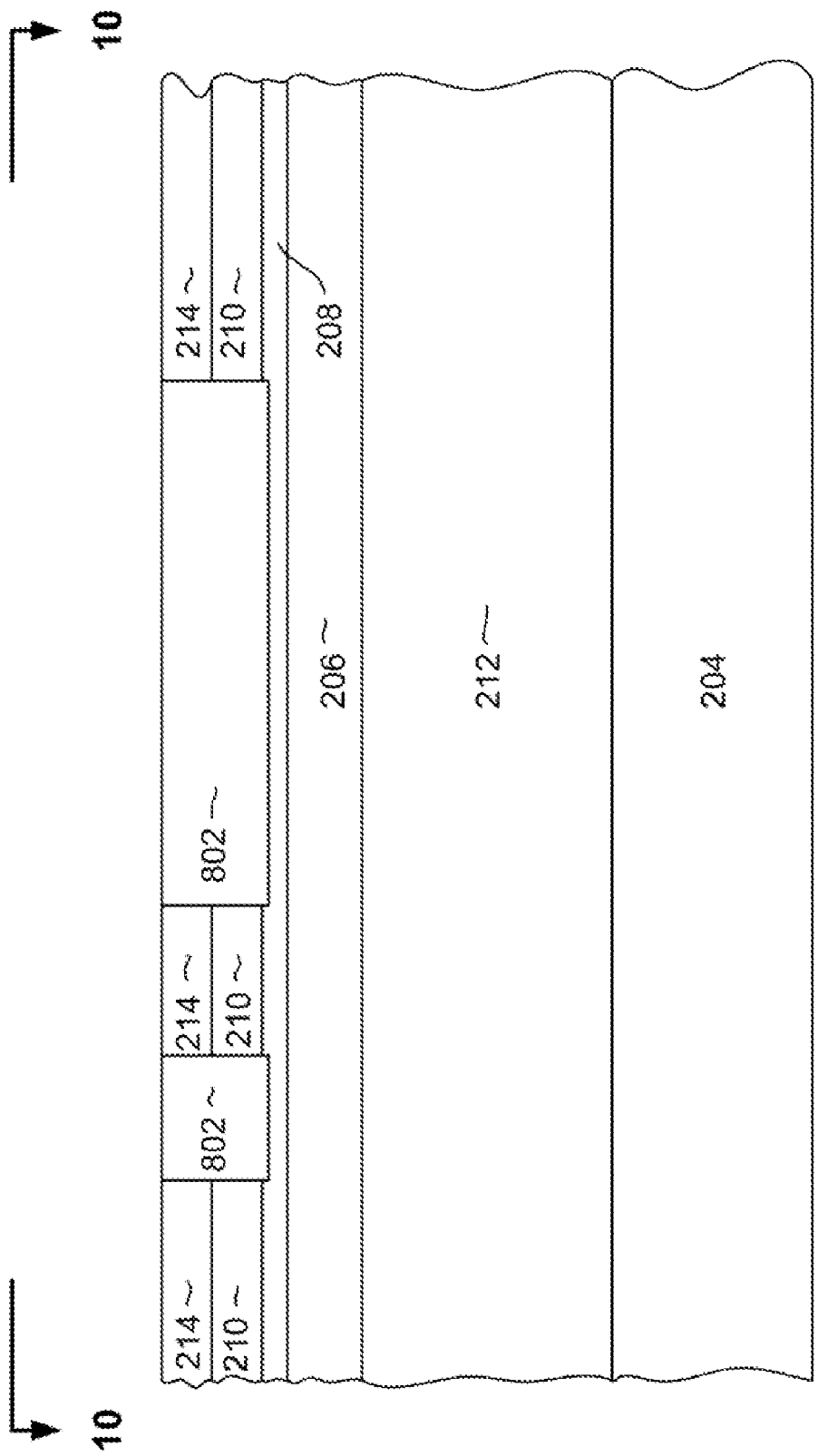
Figure 10:
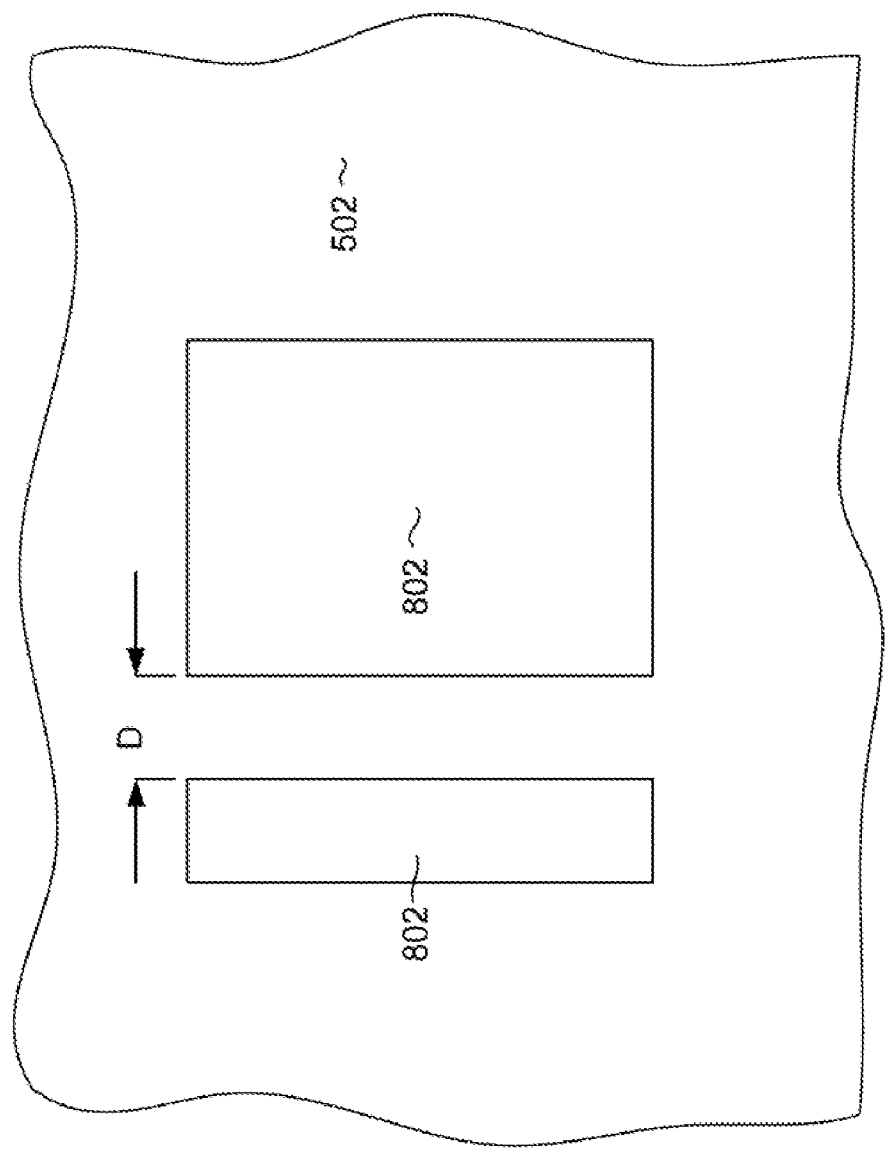

The mask structure can then be lifted off, leaving a structure as shown in FIG. 9, with an electrically conductive metal imbedded in the sensor layers 502. The mask can be lifted off by moving the wafer from the IBE/IBD tool to a tank of hot NMP where the mask is dissolved. This has the effect of lifting off the residual metal from regions where it is not wanted. FIG. 10 shows a top down view of the structure of FIG. 9 and shows an arrangement of the metal fill layers 802.

The photolithography step used to define the mask structure 602 (FIG. 6) and subsequent imbedded metal pockets 802 (FIG. 10) is a single photolithographic process, which facilitates placement of the two metal pockets 802 relative to one another. The metal regions 802 can be wide and there is only one critical dimension. This critical dimension is the distance D between the two metal regions 802, which can be as little as 10 nm.

Figure 11:
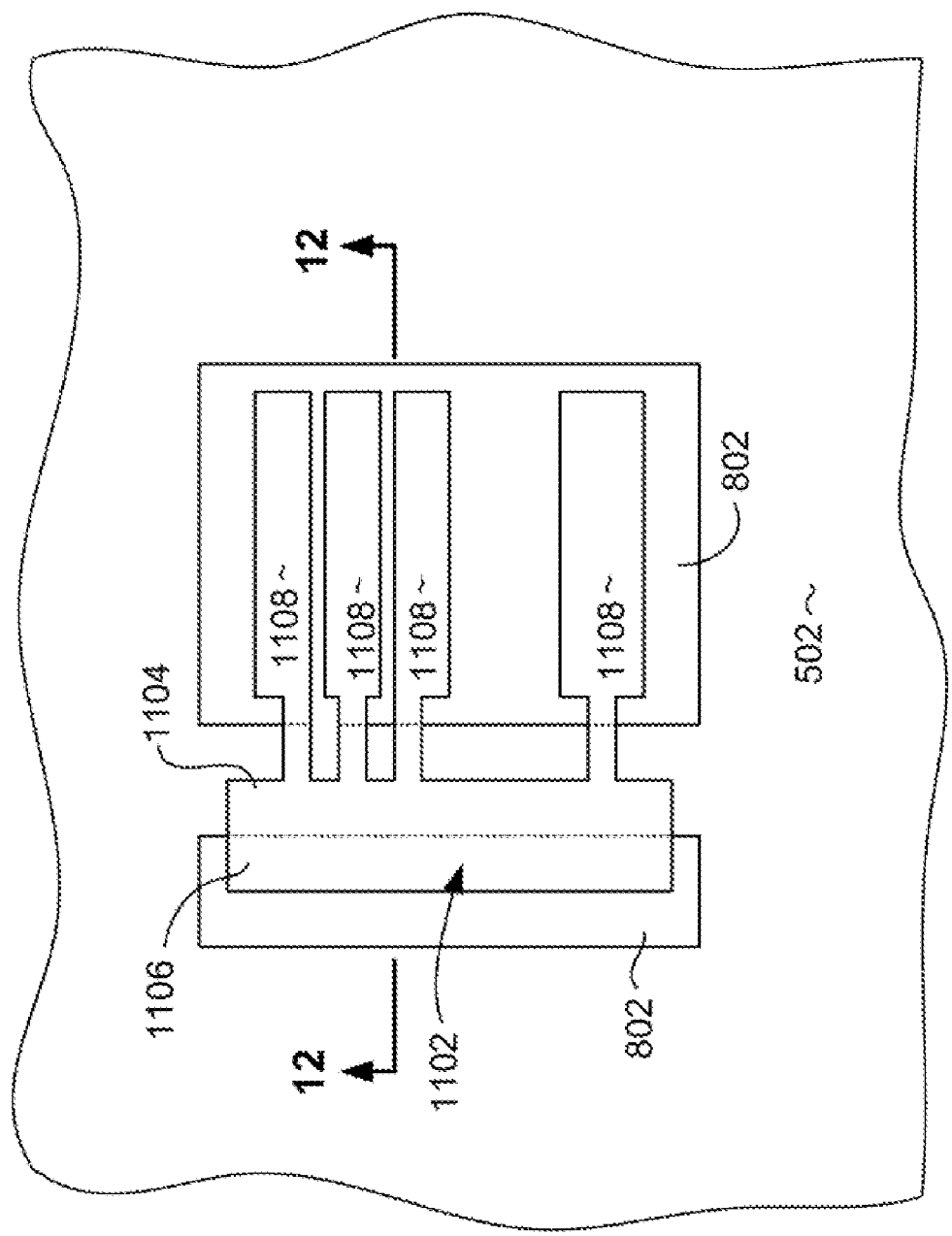
Figure 12:
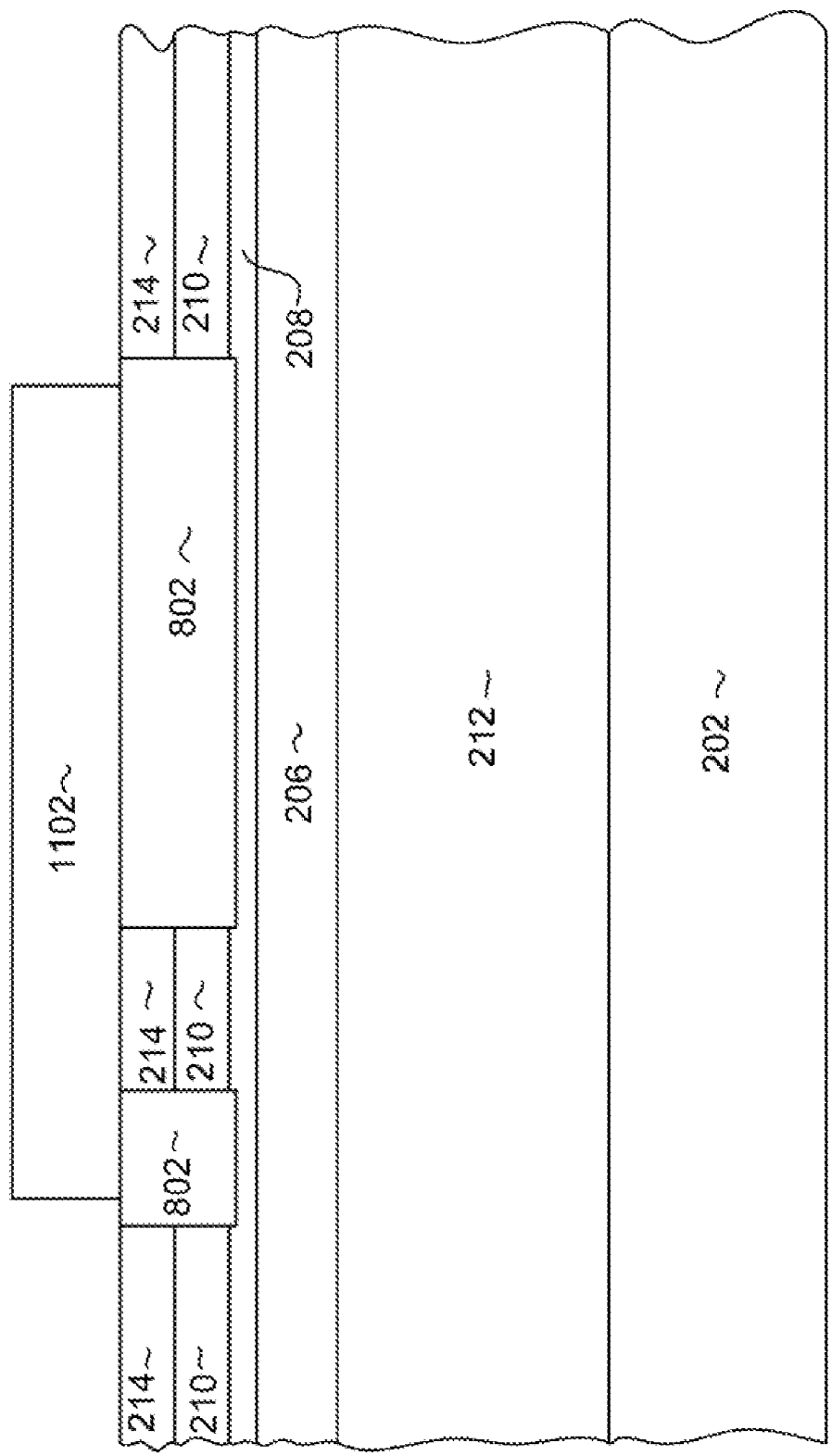

With reference now to FIGS. 11 and 12, a second mask structure 1102 is formed over the sensor layers 502 and the metal pockets 802. Portions of the metal layers 802 that pass beneath the second mask structure 1102 are shown in dashed line in FIG. 11. The mask structure 1102 has a portion 1104 over the sensor layers 502 that is configured to define a mesa structure, and has a portion 1106 (formed over one of the metal pockets 802) that is configured to define a shunt structure. The second mask structure 1102 also has portions 1108 that are configured to define lead layers.

Figure 13:
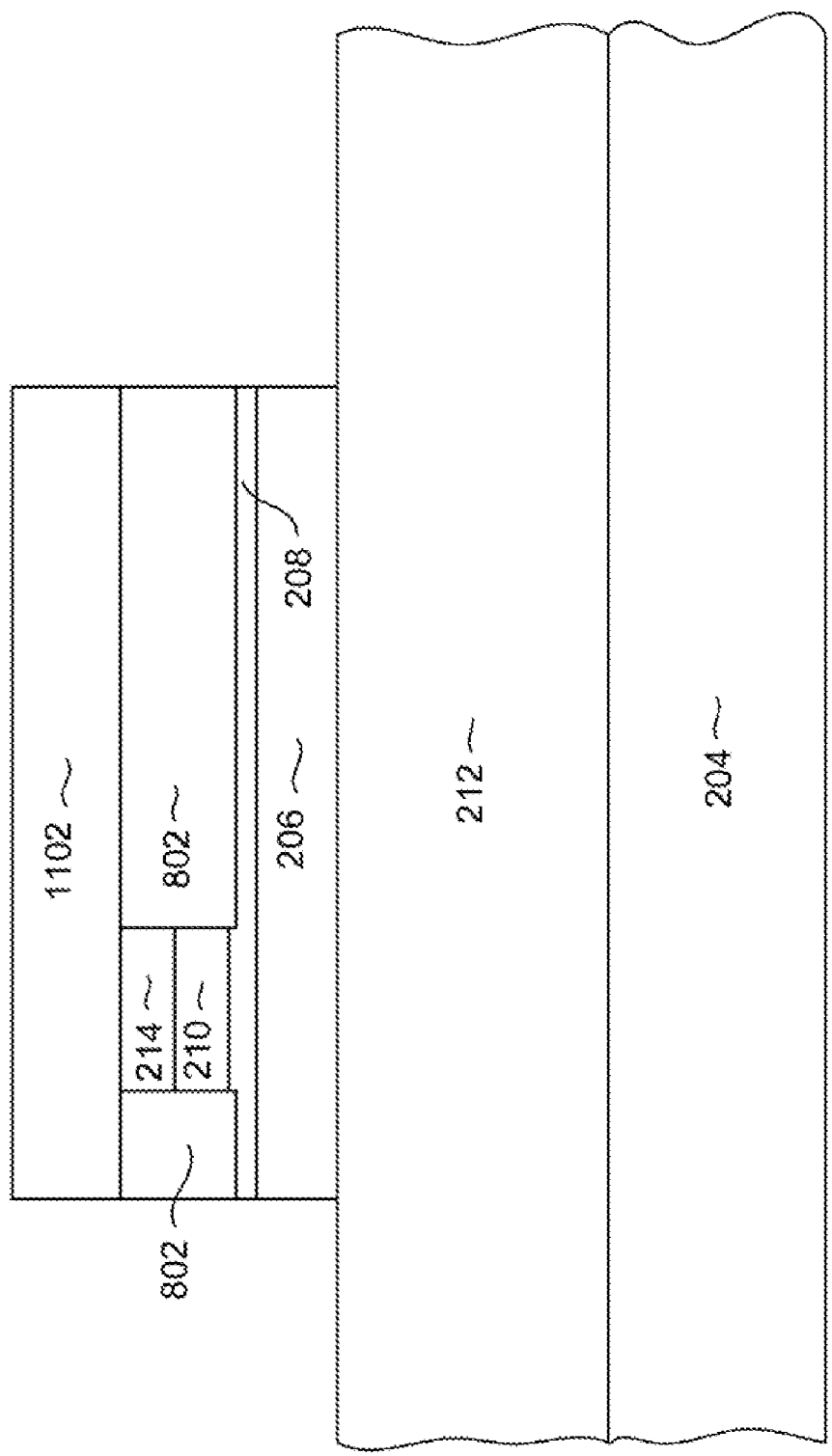

Then, with reference to FIG. 13 another etching process such as Ion Beam Etching (IBE) or Reactive Ion Etching (RIE) is performed to remove portions of the layers 206, 208, 210, 214, 802 that are not protected by the mask 1102. The etching can be terminated when the buffer layer 212 has been reached or can continue until the substrate 204 has been reached.

Figure 14:
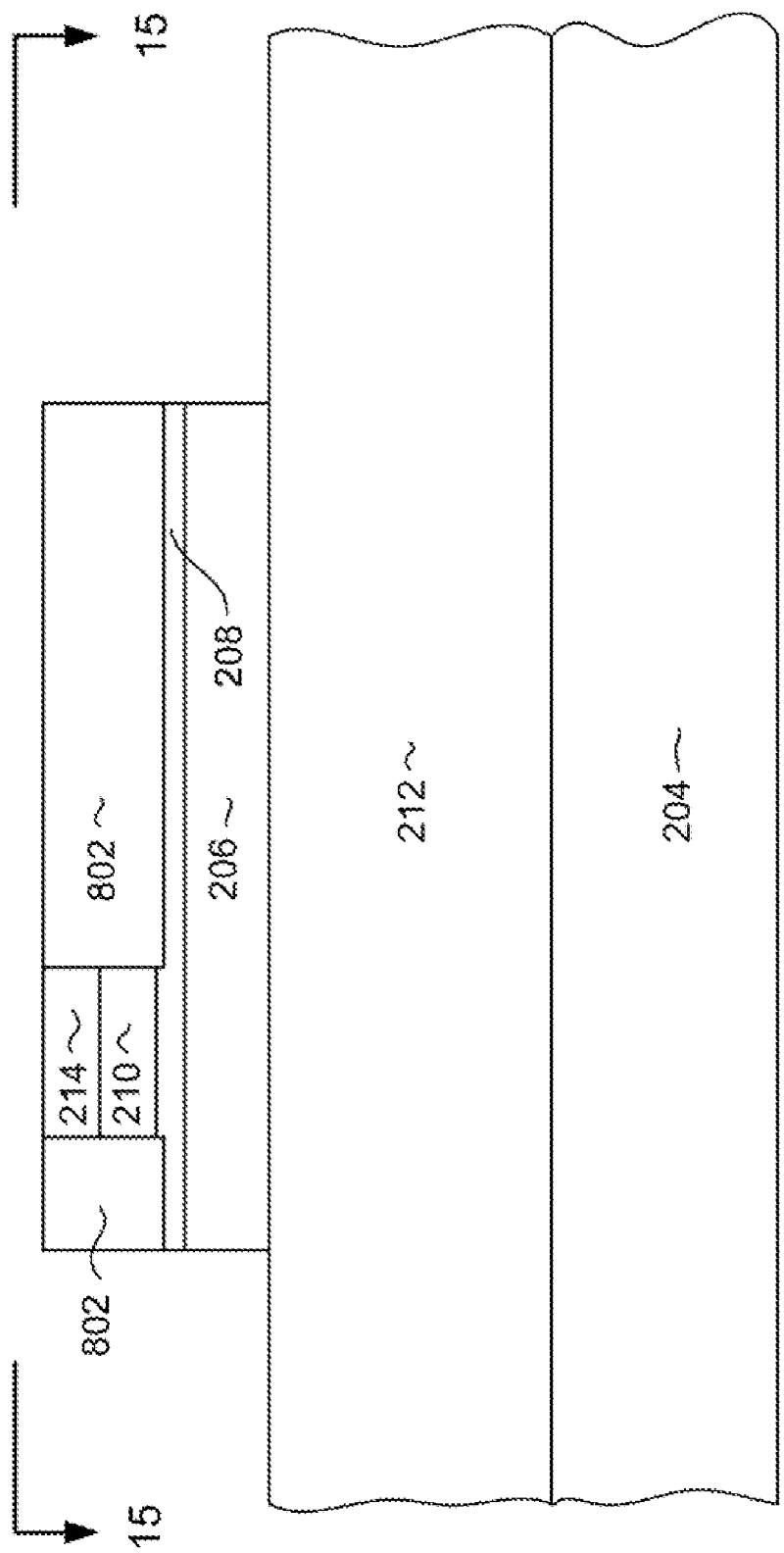
Figure 15:
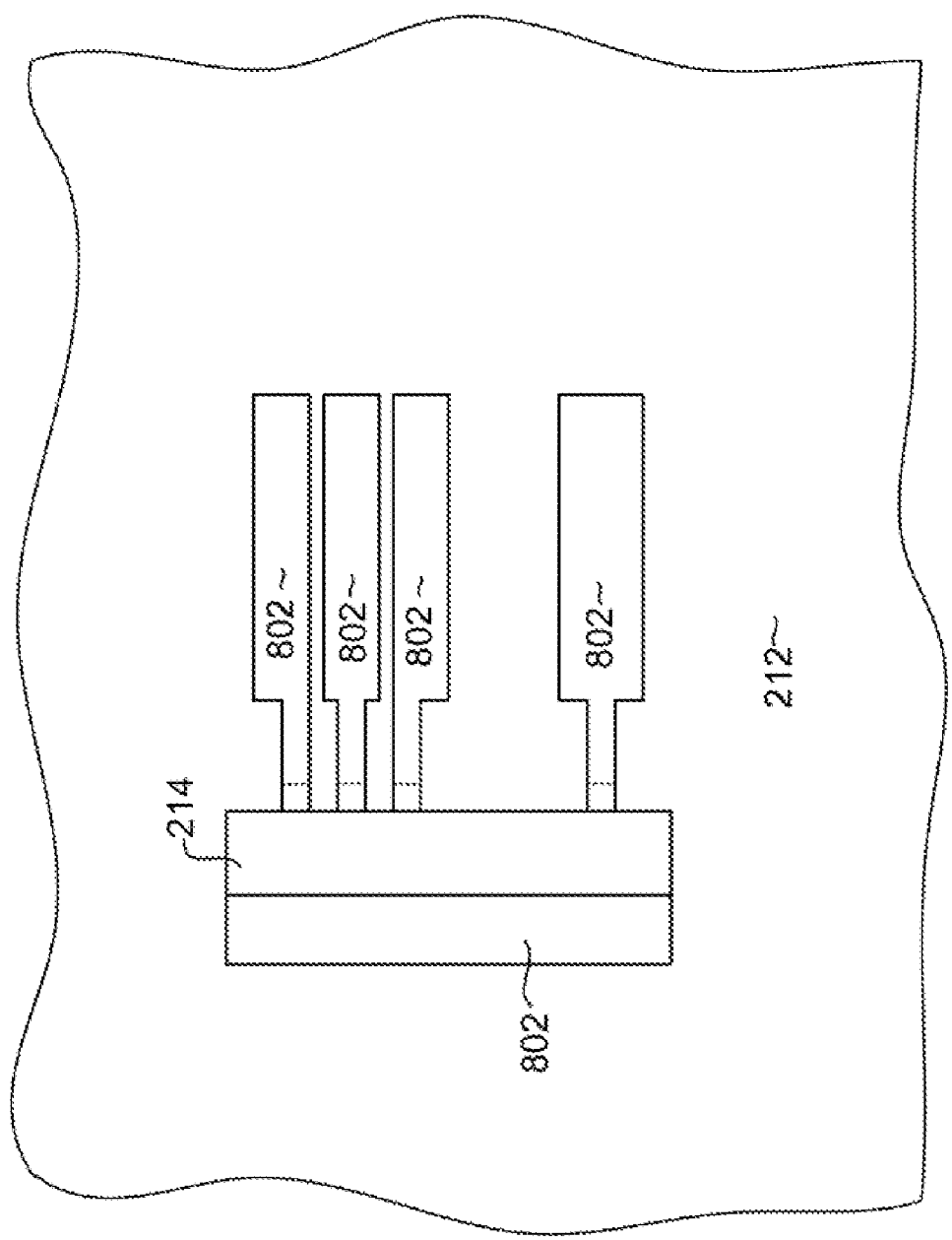

Then, with reference to FIGS. 14 and 15, the second mask structure 1102 can be removed, leaving a sensor structure wherein the portion of the metal 802 (to the right in FIGS. 14 and 15) defines the leads 302, 304, 306, 308 discussed previously with reference to FIG. 3. The other portion of the remaining metal layer 802 (to the left in FIGS. 14 and 15) defines the shunt structure 216 described above with reference to FIGS. 2 and 3.

While various embodiments have been described above, it should be understood that they have been presented by way of example only, and not limitation. Other embodiments falling within the scope of the invention may also become apparent to those skilled in the art. For example, although the invention has been described as providing an EMR sensor for use in a magnetic data recording system such as a disk drive, the present invention could also be used in the construction of an EMR sensor to be used in another device such as a scanning magnetometer or in any other application where a magnetic signal can be read. Thus, the breadth and scope of the invention should not be limited by any of the above-described exemplary embodiments, but should be defined only in accordance with the following claims and their equivalents.

What is claimed is:

1. An Extraordinary Magnetoresistive (EMR) sensor, comprising:
   first, second and third semiconductor layers, the second semiconductor layer being sandwiched between the first and third semiconductor layers and forming a 2 dimensional electron gas (2DEG) therebetween, the third semiconductor layer having first and second sides, the second semiconductor layer extending beyond the first side, and having a plurality of tab structures that extend beyond the second side and beyond the second semiconductor layer;
   an electrically conductive shunt structure formed adjacent to the first side of the third semiconductor layer and contacting a surface of the second semiconductor layer where the second semiconductor layer extends beyond the first side; and
   a plurality of electrically conductive leads each one of the plurality of electrically conductive leads contacting one of the tab structures of the second semiconductor layers.

2. An EMR sensor as in claim 1 wherein each of the lead layers is self aligned with the tab structure to which it is in contact.

3. An EMR sensor as in claim 1 wherein the electrically conductive shunt structure contacts the third semiconductor layer and the second semiconductor layer, but terminates short of the first semiconductor layer.

4. An EMR sensor as in claim 1 wherein the electrically conductive shunt structure contacts the third semiconductor layer and terminates at the second semiconductor layer.

5. An EMR sensor as in claim 1 wherein the plurality of electrically conductive leads and the electrically conductive shunt structure comprises the same material.

6. An EMR sensor as in claim 1 wherein the plurality of electrically conductive leads and the electrically conductive shunt structure each comprise Ta or Au.

7. An EMR sensor as in claim 1 wherein the plurality of electrically conductive leads and the electrically conductive shunt structure each comprise a layer of Ta and a layer of Au.

8. An EMR sensor as in claim 1 wherein the plurality of leads each comprise a layer of Ta and a layer of Au formed over the layer of Ta.

9. A magnetic data storage system, comprising:
   a magnetic medium, moveably mounted within the housing;
   an actuator mounted within the housing;
   a slider connected with the actuator for movement adjacent to a surface of the magnetic medium, and a magnetoresistive sensor formed on the slider, the sensor further comprising:
   first, second and third semiconductor layers, the second semiconductor layer being sandwiched between the first and third semiconductor layers and forming a 2 dimensional electron gas (2DEG) therebetween, the third semiconductor layer having first and second sides, the second semiconductor layer extending beyond the first side, and having a plurality of tab structures that extend beyond the second side and beyond the second semiconductor layer;
   an electrically conductive shunt structure formed adjacent to the first side of the third semiconductor layer and contacting a surface of the second semiconductor layer where the second semiconductor layer extends beyond the first side; and
   a plurality of electrically conductive leads each one of the plurality of electrically conductive leads contacting one of the tab structures of the second semiconductor layers.

10. An magnetic data storage system as in claim 9 wherein each of the lead layers is self aligned with the tab structure to which it is in contact.

11. A magnetic data storage system as in claim 9 wherein the electrically conductive shunt structure contacts the third semiconductor layer and the second semiconductor layer, but terminates short of the first semiconductor layer 12. A magnetic data storage system as in claim 9 wherein the electrically conductive shunt structure contacts the third semiconductor layer and terminates at the second semiconductor layer.

13. A magnetic data storage system as in claim 9 wherein the plurality of electrically conductive leads and the electrically conductive shunt structure comprise the same material.

14. A magnetic data storage system as in claim 9 wherein the plurality of electrically conductive leads and the electrically conductive shunt structure each comprise Ta or Au.

* * * * *

UNITED STATES PATENT AND TRADEMARK OFFICE
CERTIFICATE OF CORRECTION

| | |
|---|---|
| PATENT NO. | : 8,035,927 B2 |
| APPLICATION NO. | : 12/021085 |
| DATED | : October 11, 2011 |
| INVENTOR(S) | : Thomas Dudley Boone et al. |

It is certified that error appears in the above-identified patent and that said Letters Patent is hereby corrected as shown below:

In the Specification:

Column 1, line 53 replace "tree layer." with --free layer.--;

Column 1, line 67 replace "tree layers" with --free layers--.

Signed and Sealed this
Seventh Day of July, 2015

Michelle K. Lee
*Director of the United States Patent and Trademark Office*